(12) United States Patent
Pickett et al.

(10) Patent No.: US 9,846,565 B2
(45) Date of Patent: *Dec. 19, 2017

(54) SHIFTABLE MEMORY EMPLOYING RING REGISTERS

(75) Inventors: Matthew D. Pickett, San Francisco, CA (US); R. Stanley Williams, Portola Valley, CA (US); Gilberto M. Ribeiro, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 341 days.

This patent is subject to a terminal disclaimer.

(21) Appl. No.: 14/349,352

(22) PCT Filed: Oct. 27, 2011

(86) PCT No.: PCT/US2011/058177
§ 371 (c)(1),
(2), (4) Date: Apr. 3, 2014

(87) PCT Pub. No.: WO2013/062559
PCT Pub. Date: May 2, 2013

(65) Prior Publication Data
US 2014/0304467 A1    Oct. 9, 2014

(51) Int. Cl.
*G06F 5/08* (2006.01)
*G11C 19/00* (2006.01)
(Continued)

(52) U.S. Cl.
CPC .............. *G06F 5/08* (2013.01); *G11C 7/1012* (2013.01); *G11C 7/1036* (2013.01); *G11C 19/00* (2013.01); *G11C 19/28* (2013.01); *G11C 21/00* (2013.01)

(58) Field of Classification Search
CPC . G06F 5/10; G06F 5/08; G06F 3/0647; G06F 3/067; G11C 19/00; G11C 21/00; G11C 19/28; G11C 7/1012; G11C 7/1036
(Continued)

(56) References Cited

U.S. PATENT DOCUMENTS 3,670,313 A * 6/1972 Beausoleil ......... G11C 19/0875
365/14
3,708,690 A * 1/1973 Paivinen ............. G11C 19/184
327/294

(Continued)

FOREIGN PATENT DOCUMENTS

CN   101162471   4/2008
EP   0827156    4/1998
(Continued)

OTHER PUBLICATIONS

Chen-Yi Lee et al., "High-Speed Median Filter Designs Using Shiftable Content-Addressable Memory," IEEE Trans. Circuits and Systems for Video Tech., vol. 4, No. 6, Dec. 1994, pp. 544-549.
(Continued)

*Primary Examiner* — Midys Rojas
*Assistant Examiner* — Khoa D Doan
(74) *Attorney, Agent, or Firm* — Trop, Pruner & Hu, P.C.

(57) ABSTRACT

Shiftable memory employs ring registers to shift a contiguous subset of data words stored in the ring registers within the shiftable memory. A shiftable memory includes a memory having built-in word-level shifting capability. The memory includes a plurality of ring registers to store data words. A contiguous subset of data words is shiftable between sets of the ring registers of the plurality from a first location to a second location within the memory. The contiguous subset of data words has a size that is smaller than a total size of the memory. The memory shifts only data
(Continued)

words stored inside the contiguous subset when the contiguous subset is shifted.

20 Claims, 5 Drawing Sheets

(51) Int. Cl.
    *G11C 19/28*     (2006.01)
    *G11C 21/00*     (2006.01)
    *G11C 7/10*     (2006.01)

(58) Field of Classification Search
    USPC .......................................... 711/109, 110, 165
    See application file for complete search history.

(56) References Cited

U.S. PATENT DOCUMENTS

| | | | | |
|---|---|---|---|---|
| 3,760,382 A * | 9/1973 | Itoh | G11C 19/00 | 365/238 |
| 3,797,002 A | 3/1974 | Brown | | |
| 3,838,396 A * | 9/1974 | Martin | B41J 5/42 | 711/109 |
| 3,893,088 A * | 7/1975 | Bell | G11C 8/04 | 365/231 |
| 3,916,388 A * | 10/1975 | Shimp | G06F 9/30032 | 708/518 |
| 4,037,205 A * | 7/1977 | Edelberg | G06F 7/22 | 707/999.007 |
| 4,133,043 A * | 1/1979 | Hiroshima | G11C 19/0875 | 365/15 |
| 4,322,365 A * | 3/1982 | Merger | C07C 263/12 | 560/338 |
| 4,322,635 A * | 3/1982 | Redwine | G11C 19/184 | 365/189.12 |
| 4,504,925 A * | 3/1985 | Gilhousen | G06F 7/78 | 365/221 |
| 4,521,874 A * | 6/1985 | Rau | G06F 17/30982 | 365/221 |
| 4,845,670 A * | 7/1989 | Nishimoto | G11C 7/1036 | 365/78 |
| 4,864,544 A * | 9/1989 | Spak | G06F 7/78 | 327/203 |
| 5,050,067 A * | 9/1991 | McLagan | G06F 9/462 | 710/260 |
| 5,153,846 A * | 10/1992 | Rao | G06F 5/16 | 708/319 |
| 5,504,919 A * | 4/1996 | Lee | G06F 7/24 | |
| 5,625,355 A * | 4/1997 | Takeno | H03M 7/425 | 341/106 |
| 5,677,864 A * | 10/1997 | Chung | G06F 9/3879 | 365/230.03 |
| 5,930,323 A * | 7/1999 | Tang | B82Y 10/00 | 326/134 |
| 6,061,417 A * | 5/2000 | Kelem | G06F 7/584 | 377/26 |
| 6,362,660 B1* | 3/2002 | Deng | G11C 19/00 | 257/24 |
| 6,411,230 B1* | 6/2002 | Tauchen | G11C 19/28 | 341/100 |
| 6,493,794 B1* | 12/2002 | Yamashita | G06F 5/10 | 326/93 |
| 6,560,696 B1* | 5/2003 | Hummel | G06F 9/30134 | 711/109 |
| 6,725,347 B2* | 4/2004 | Yang | G06F 13/1642 | 710/52 |
| 6,745,216 B1* | 6/2004 | Nakamura | G06F 5/08 | 708/209 |
| 6,765,832 B1* | 7/2004 | Ohtani | G11C 11/4085 | 365/185.23 |
| 6,834,005 B1* | 12/2004 | Parkin | G11C 11/14 | 365/80 |
| 7,027,338 B2* | 4/2006 | Lee | G11C 17/165 | 365/200 |
| 7,051,153 B1* | 5/2006 | Lin | G11C 19/38 | 365/189.12 |
| 7,093,084 B1* | 8/2006 | Leblanc | G11C 19/38 | 711/104 |
| 7,293,132 B2* | 11/2007 | Hurley | G06F 5/14 | 709/234 |
| 7,463,056 B1* | 12/2008 | Anderson | G11C 19/00 | 326/38 |
| 7,508,701 B1* | 3/2009 | Liang | H01L 27/108 | 257/133 |
| 7,570,611 B2* | 8/2009 | Stone | G06F 15/16 | 370/324 |
| 8,510,503 B2* | 8/2013 | Yagihashi | G06F 5/14 | 341/97 |
| 8,717,831 B2* | 5/2014 | Hadley | G11C 7/22 | 365/189.08 |
| 8,972,630 B1* | 3/2015 | Stark | G06F 3/0683 | 710/54 |
| 2002/0194401 A1* | 12/2002 | Sakugawa | G06F 13/30 | 710/28 |
| 2003/0147488 A1* | 8/2003 | Nakamura | G11C 19/28 | 377/64 |
| 2004/0019715 A1* | 1/2004 | Apfeldorfer | G06F 5/10 | 710/57 |
| 2005/0163277 A1* | 7/2005 | Georgakos | G11C 8/04 | 377/64 |
| 2009/0193384 A1* | 7/2009 | Sima | H03K 19/17736 | 716/128 |
| 2010/0023730 A1* | 1/2010 | Leeland | G06F 9/30134 | 712/202 |
| 2010/0164972 A1* | 7/2010 | Akerib | G09G 5/06 | 345/560 |
| 2011/0022791 A1* | 1/2011 | Iyer | G06F 12/08 | 711/105 |
| 2013/0282974 A1* | 10/2013 | Joisha | G11C 19/00 | 711/109 |
| 2014/0126309 A1* | 5/2014 | Kelly | G11C 19/28 | 365/189.12 |
| 2014/0297985 A1* | 10/2014 | Graefe | G11C 15/04 | 711/165 |
| 2014/0310453 A1* | 10/2014 | Golab | G11C 19/188 | 711/109 |
| 2014/0379977 A1* | 12/2014 | Perner | G11C 11/417 | 711/105 |
| 2015/0006809 A1* | 1/2015 | Harizopoulos | G11C 19/00 | 711/109 |
| 2015/0046644 A1* | 2/2015 | Karp | G11C 19/00 | 711/109 |

FOREIGN PATENT DOCUMENTS

| | | |
|---|---|---|
| JP | 63231798 | 9/1988 |
| JP | 5066921 | 9/1993 |
| WO | WO-1993014459 | 7/1993 |

OTHER PUBLICATIONS

PCT; "Notification of Transmittal of the International Search Report and Drive the Written Opinion of the International Searching Authority, or the Declaration"; cited in Appl. No. PCT/US2011/058177; dated Feb. 9, 2012; 9 pages.

Roberto Perez-Andrade et al., "A Versatile Linear Insertion Sorter Based on a FIFO Scheme," IEEE Computer Society Annual Symposium on VLSI, 2008, pp. 357-362.

* cited by examiner

| 00 | 01001000 |
| 01 | 01111000 |
| 02 | 11001000 |
| 03 | 01001110 |
| 04 | 11001010 |
| 05 | 01001010 |
| 06 | 11111011 |
| 07 | 00000001 |
| 08 | 11011011 |
| 09 | 01101111 |
| 10 | 11101011 |
| 11 | 01111010 |

| 00 | 01001000 |
| 01 | 01111000 |
| 02 | 11001000 |
| 03 | 01001110 |
| 04 | X |
| 05 | 11001010 |
| 06 | 01001010 |
| 07 | 11111011 |
| 08 | 00000001 |
| 09 | 11011011 |
| 10 | 11101011 |
| 11 | 01111010 |

*FIG. 1A*

| 00 | abc |
| 01 | def |
| 02 | ghi |
| 03 | jkl |
| 04 | mno |
| 05 | pqr |
| 06 | stu |
| 07 | vwx |
| 08 | yza |
| 09 | bcd |
| 10 | efg |
| 11 | hij |

| 00 | abc |
| 01 | def |
| 02 | jkl |
| 03 | mno |
| 04 | pqr |
| 05 | stu |
| 06 | X |
| 07 | vwx |
| 08 | yza |
| 09 | bcd |
| 10 | efg |
| 11 | hij |

*FIG. 1B*

SHIFTABLE MEMORY EMPLOYING RING REGISTERS

CROSS-REFERENCE TO RELATED APPLICATION

This application is a national stage application under 35 U.S.C. §371 of PCT/US2011/058177, filed Oct. 27, 2011.

STATEMENT REGARDING FEDERALLY SPONSORED RESEARCH OR DEVELOPMENT

N/A

BACKGROUND

Modern computers and related processing systems typically include a processor and some form of memory. The processor is generally responsible for performing the various computational tasks of the computer while the memory stores data that is used in and generated by the computational tasks. The architectural division of processing by the processor and data storage by the memory has proven successful for nearly the entire history of such systems.

For example, a typical general-purpose computer usually includes a central processing unit (CPU) and a main memory that communicate with one another over one or more communication channels (e.g., data, command and address buses). Typically, the CPU provides facilities to perform various arithmetic and logical operations, to provide operational sequencing and to otherwise control aspects of the general-purpose computer. For example, virtually all CPUs provide functions or operations for reading data from memory, writing data to memory and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display unit (e.g., a monitor), in some examples.

In contrast, the main memory of modern computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in or that are often associated with the main memory of modern computers are certain memory management functions. For example, DRAM memory subsystems of main memory may possess circuitry for automatic refresh of data stored therein.

However, the historical architectural division of processing in the processor and storage in memory does present certain problems that are becoming more and more evident as time goes on. In particular, the conventional architectural division that centralizes all processing in the CPU while relegating the main memory to providing storage can and does present problems, especially as an amount of data being processed increases in size. For example, to process or otherwise manipulate a large data set, all of the data must typically be transported back and forth multiple times between the CPU and the memory via the data bus. Even with sophisticated caching and pre-fetching schemes, the data bus can present a significant bottleneck to overall processing performance, for example.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which:

FIG. 1A illustrates an example of a downshift of a contiguous subset of data stored in a linear array within a shiftable memory, according to an example in accordance with the principles described herein.

FIG. 1B illustrates an example of an upshift of a contiguous subset of data stored in a linear array within a shiftable memory, according to an example in accordance with the principles described herein.

Figures 2, 3:
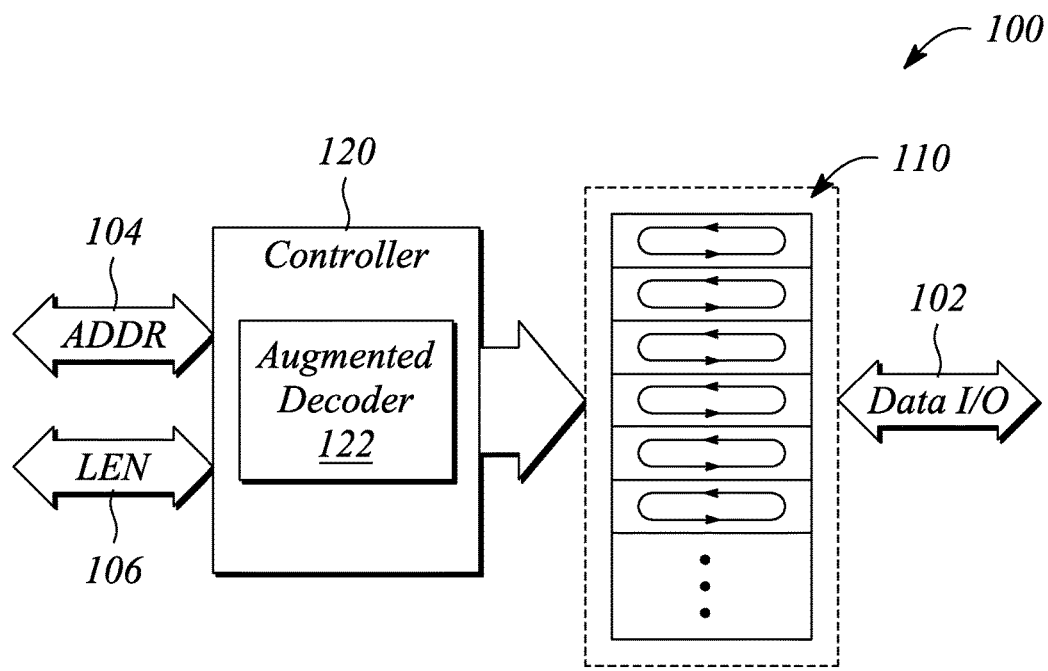
FIG. 2 illustrates a block diagram of a shiftable memory, according to an example in accordance with the principles described herein.
FIG. 3 illustrates a truth table of an augmented decoder, according to an example in accordance with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide a data shifting capability in memory. In particular, the data shifting capability is substantially built into the memory that employs ring registers, according to various examples of the principles described herein. The built-in data shifting capability provides a lateral translation or shift of a contiguous subset of data stored in the memory while the ring registers facilitate reading and writing data to and from selected memory locations. For example, the contiguous subset of stored data (e.g., data words) may be shifted within the memory from a first memory location to a second memory location. The stored data retain an ordered relationship within the contiguous subset when shifted to the second location. Moreover, the shift takes place entirely within the memory, according to various examples. Specifically, the shift is generally accomplished without using resources, such as a processor, that are outside of the memory and does not involve data being moved between a processor and the memory. As a result, the memory with built-in shifting capability is referred to as 'shiftable memory' herein.

According to some examples, the shift provided by shiftable memory herein may be employed to 'open' a location in memory into which a new data word may be inserted. In particular, a memory location either above or below the contiguous subset of stored data may be rendered available for data insertion when the contiguous subset of stored data is moved by the shift within the shiftable memory. According to other examples, the shift may be used to delete or 'overwrite' data stored one of above a beginning of the contiguous subset and below an end of the contiguous subset. In particular, the data stored above or below the contiguous subset may be overwritten with a portion of the contiguous subset itself, when the contiguous data is shifted by the shiftable memory. For example, if the contiguous subset of stored data is part of a larger data structure (e.g., an array of data words) in the shiftable memory, the shift may have the effect of deleting a portion of the data (e.g., one or more data words) in the larger data structure (e.g., the array of data words). According to some examples, shifting data to either insert data or delete data in the shiftable memory may be accomplished in less time, and in some examples in considerably less time, than is generally possible without using shiftable memory. In fact, the shift may be accomplished in substantially constant time (e.g., a fixed number of clock cycles) using shiftable memory, according to some examples.

In contrast, conventional memory that relies on a processor, for example, to perform a shift generally requires an amount of time that is proportional to an amount of data being shifted. For example, shifting data in conventional memory typically involves the processor reading the data to be shifted and then writing the data back to memory in another location. Reading and writing may be performed by the processor on a word-by-word basis due to the structure and functionality of conventional memory, for example. Since each data word in the data being shifted is first read from the conventional memory by the processor and then subsequently written back to the conventional memory, the time to shift the data is generally proportional to the amount or length of the data (e.g., number of data words) being shifted, for example. The larger the amount of data, the longer the shift operation will take.

Moreover, conventional memory relies on a resource (e.g., the processor) that is external to the conventional memory to perform the reading and writing when shifting the data. Since the resource performing the shift is external to the conventional memory, each of the data words involved in the word-by-word shift must pass between the external resource and the conventional memory through some form of data bus or similar communication channel. The data bus or similar communication channel may substantially limit a speed of the read and write operations and, as a result, an overall speed of the shift. Hence, shifting large subsets of data can become prohibitively expensive in terms of the processing time due to one or both of the effects of data bus speed and the proportional time aspects of performing a shift using conventional memory.

In accordance with the principles described herein, shiftable memory has built-in shifting capability so that data does not have to be read and then written by an external resource to perform a shift, for example. The contiguous subset of stored data is identified to the shiftable memory (e.g., using an address and a length) and the shiftable memory is instructed to shift the contiguous subset. The shift is then accomplished by and takes place entirely within the shiftable memory. Speed limitations associated with transferring data to and from an external resource are substantially eliminated by shiftable memory, according to examples of the principles described herein. Moreover, time for shifting may be substantially independent of the length of the contiguous subset, for example.

In particular, shifting within the shiftable memory may be implemented with circuitry of the shiftable memory itself, for example. As such, shifting using shiftable memory does not require sequentially reading and writing each data word of the contiguous subset, according to some examples. For example, shifting using shiftable memory may shift all of the stored data in the contiguous subset in a substantially simultaneous manner. As such, the shiftable memory may implement shifting of the contiguous subset in a time that is substantially independent of the length of the contiguous subset.

In some examples, the shiftable memory may perform the shift in substantially constant time, according to the principles described. By 'constant time' it is meant that a substantially similar amount of time is required to shift the contiguous subset of stored data regardless of the length of the contiguous subset. For example, an arbitrary length contiguous subset may be shifted in a single clock cycle, according to some examples. In another example, a shorter contiguous subset may need only a single clock cycle while a longer contiguous subset may require two or more clock cycles. However, while the shiftable memory may use more time for longer subsets than relatively shorter subsets, the shift is still performed in substantially constant time since the time required is not strictly proportional to the contiguous subset length.

Herein, the term 'memory' refers to any sort of memory that can receive and store data. The memory is generally consistent with memory that may be employed by a computer processor or in a computer system, for example. In particular, by definition herein, memory refers to any sort of memory that can be written to and read from during operation of the computer that employs the memory. For example, the memory may comprise random access memory (RAM). The random access memory may be static RAM (SRAM), for example. Other types of memory include, but are not limited to, dynamic random access memory (DRAM), flash and similar non-volatile memories that are writable during operation of the computer, various forms of optical memory (e.g., re-writable optical discs), magnetic memory (e.g., computer hard drives) and various memory structures based on latches, flip-flops and other bi-stable constructs.

Also herein, a memory may comprise a plurality of groups of memory cells collectively referred to as a 'register'. A plurality of registers, in turn, may be arranged in an array. For example, the registers may be arranged as a linear array of registers. In another example, the registers are arranged in a two dimensional (2-D) array. Higher order (e.g., three or more dimensions) arrays also may be employed. In some example, a lower order array (e.g., a linear array) is defined on an array with a larger dimension (e.g., 2-D array). For example, a linear array may be defined by an addressing arrangement on a rectangular 2-D array of registers. In addition, arrays may be divided into sub-arrays. For example, a 2-D array may be divided into quadrants as four sub-arrays. According to various examples, the array may be either a physical array or a logical array. A physical array comprises registers that are physically organized or located relative to one another according to or as defined by the array. A logical array comprises a logical arrangement of the registers as an array. In a logical array, a physical arrangement of the memory cells may differ from the logical arrangement defined by the array, for example. Logical arrays may be defined using address indirection, for example.

A memory cell is a circuit or related construct that holds or stores data, as defined and employed herein. Further, by definition herein, memory cells may store one or more 'bits' of data. For example, the bit may be a binary value (e.g., '0' or '1') and the memory cell may hold a single bit. In another example, the memory cell may hold a plurality of binary value bits. In particular, the memory cell may hold or store a complete data word comprising the plurality of bits, as defined herein. For example, a memory cell may hold 4, 8, 16, 32 or 64 binary bits. In yet another example, the memory cell may hold data in another form (e.g., a hexadecimal value, an analog value, etc.). In particular, memory cells, as defined herein, are not restricted to storing data in a binary format but may, in some examples, hold or store an arbitrary data construct. However, for discussion purposes herein, binary data is generally employed throughout by way of example and not by way of limitation, unless otherwise stipulated.

As used herein, a 'register' or equivalently 'memory register' is defined as a collection or grouping of memory cells. Further herein, a register comprising a grouping of memory cells may hold data (e.g., a plurality of data bits) that constitute the data word of a particular computer system. Hence, the contents of a register are generally referred to as a 'data word,' herein. In some examples, the memory cells of a memory register are physically adjacent to one another. For example, a first memory cell of a memory register may be located immediately next to a second memory cell of the memory register. In other examples, the memory cells of a memory register are logically related instead of or in addition to being physically collocated. In particular, adjacent memory cells may not be necessarily physically adjacent to be logically adjacent, in some examples.

Memory registers are also often referred to as 'memory locations' herein. Strictly speaking, a memory location is a memory register at a location within the memory, the location being designated or identified by an address. The memory register is accessed using the address, for example. However, for simplicity of discussion herein, memory registers are generally referred to as having or being at an address. Addresses or locations may be associated with a shiftable unit (e.g., a data word) of the memory, for example. As such 'location' and address may be employed interchangeably herein. In addition 'location' may be used to refer to a location of a contiguous set of data that is designated by a starting address and an ending address, according to some examples. In other examples, the location of the contiguous set may be designated by a starting (or an ending) address and a length of the contiguous set.

Adjacent memory registers as defined by adjacent memory locations may be physically adjacent (i.e., located next to one another) or logically adjacent, by definition herein. Logical adjacency may be established by an overlying logical memory structure (e.g., using indirection), according to some examples. For example, logically adjacent memory registers may be physically separated from one another but still be considered adjacent in terms of an overlying memory structure that employs interleaving. Likewise, the contiguous subset may be physically contiguous (i.e., located in physically adjacent memory registers) or logically contiguous. In particular, the contiguous subset of data words as stored in the adjacent ring registers of the shiftable memory acquires a contiguity that is analogous to and dictated by the adjacency of the registers, by definition herein.

As defined herein, a 'ring register' is a memory register comprising a plurality of interconnected memory cells that are configured to shift or circulate data between adjacent memory cells of the plurality in a circular manner. In particular, data shifted or circulated in a ring register circulates in a loop or ring around the ring register. As such, after a number of shifts equal to a length of the ring register, the data will, in general, return to an original or starting location within the ring register. The data shift or data circulation within the ring register may be unidirectional or bidirectional (e.g., dynamically selectable between either a left shift or a right shift).

In some examples, the memory register and in particular, the ring register, may be implemented using flip-flops. For example, a so-called data or 'D' flip-flop may be employed to implement the ring register of the shiftable memory. However, by definition herein, ring registers are not restricted to implementations using classical flip-flops. For example, SRAM cells may be interconnected with wiring and in some examples, logic circuits, to implement a ring register, according to various examples of the principles described herein. In addition, ring registers used in shiftable memory may provide one or both of serial read and serial write capability, by definition herein. In particular, a ring register of the shiftable memory may be loaded or programmed with external data (e.g., data words) through a serial write to the ring register, according to some examples. A serial read may be employed to sample data stored in one or more of the memory cells of the ring register, for example. In serial write, data bits are presented one-by-one to an input of the ring register and then sequentially clocked into and stored in the memory cells of the ring register, for example. Similarly, stored data bits are sequentially clocked out of the ring register and provided in a serial manner to an output during a serial read, for example. Clocking may shift or circulate data bits around the loop of the ring register, for example.

Further herein and as noted above, a shift as performed by shiftable memory is defined as a lateral translation of a contiguous subset of data stored within the memory, unless otherwise stipulated. In particular, by definition herein, a shift using shiftable memory constitutes the lateral translation (e.g., up or down an array) of the stored data (e.g., data words) within the contiguous subset from a first location to a second location within the memory. Furthermore, the shift, when applied to the contiguous subset of stored data, translates all of the stored data within the contiguous subset. Moreover, the shift by shiftable memory does not result in a lateral translation or shift of data outside of the subset of data involved in the shift, by definition herein. In general, the shift may move the data by a distance of one or more memory locations or memory addresses. For example, the shift may move the data a single memory location up or down within the memory.

Herein, the direction 'up' is defined with respect to memory locations within the shiftable memory as a direction toward locations having smaller addresses. The direction 'down' is defined as a direction toward locations having larger addresses. Hence, an 'upshift' is defined as shifting the data to a second location having a smaller address than an address of a first or starting location. Conversely, a 'downshift' results in moving the data from a first location having a smaller address to a second location with a larger address. However, while the shift direction is controllable or selectable according to some examples, the shift direction (e.g., up or down) may be completely arbitrary, as employed herein. Further, the specific use of 'upshift' and 'downshift' herein is for discussion purposes and not by way of limitation.

FIG. 1A illustrates an example of a downshift of a contiguous subset of data stored in a linear array within a shiftable memory, according to an example of the principles described herein. In particular, FIG. 1A illustrates a plurality of ring registers, each of which is capable of storing a data word. For example, the data words may comprise eight binary bits, each bit (e.g., either a '1' or '0') being stored in a separate one of eight memory cells of the ring register. Further as illustrated, each of the illustrated ring registers is identified by an address ranging from 00 to 11. A left side of FIG. 1A illustrates the plurality of ring registers before the downshift while a right side illustrates the same plurality of ring registers after the downshift.

As illustrated, the example downshift within the shiftable memory comprises selecting a contiguous subset of stored data words starting with a ring register at address 04 and ending with a ring register at address 08, for example. The selected contiguous subset contains data words {11001010, 01001010, 11111011, 0000001, 11011011} in the illustrated example. The shiftable memory then downshifts the selected contiguous subset of data words by moving the stored data words down one address location, as illustrated in the right side of FIG. 1A. The downshift maintains an order of the data words within the contiguous subset and deposits the contiguous subset in ring registers between address 05 and address 09. Downshifting the stored data overwrites the contents of a ring register immediately below the contiguous subset (i.e., at address 09) and replaces the contents of that ring register with a last data word (i.e., '11011011') of the downshifted contiguous subset. Further, the ring register at address 04 which originally held the first data value of the contiguous subset is rendered indeterminate as indicated by the 'X'. According to various examples, the ring register at address 04 may retain a copy of the data word (e.g., '11001010') that was present before the downshift or may be cleared (e.g., set to '00000000') after the downshift.

In some examples, the ring register at address 04 may be available for insertion of a data word from an external source, for example. A data word may be inserted into the ring register at address 04 by sequentially presenting and clocking or shifting individual bits of the inserted data word into the memory cells of the ring register at address 04 (e.g., a serial write), according to some examples.

FIG. 1B illustrates an example of an upshift of a contiguous subset of data stored in a linear array within a shiftable memory, according to an example of the principles described herein. In particular, FIG. 1B illustrates a plurality of ring registers each of which stores a data word (e.g., 'abc,' 'def,' etc.). Further as illustrated, each of the illustrated ring registers is identified by an address ranging from 00 to 11. A left side of FIG. 1B illustrates the plurality of ring registers before the upshift while a right side illustrates the same plurality of ring registers after the upshift.

As illustrated in FIG. 1B, the upshift in shiftable memory comprises selecting a contiguous subset of stored data words starting with a ring register at address 03 and ending with a ring register at address 06, for example. The shiftable memory then upshifts the selected contiguous subset by moving the stored data words in the selected contiguous subset up one address location, as illustrated in the right side of FIG. 1B. The upshift maintains an order of the words within the contiguous subset and deposits the contiguous subset in ring registers between address 02 and address 05. Upshifting the stored data words overwrites the contents of a ring register immediately above the contiguous subset (i.e., at address 02) replacing the contents of that ring register with a first word (i.e., 'jkl') of the upshifted contiguous subset. Further, the ring register at address 06 which originally held the last word of the contiguous subset is rendered indeterminate as indicated by the 'X'. According to some examples, the ring register at address 06 may retain a copy of the data word (e.g., 'stu') that was present before the upshift or may be cleared (e.g., set to '000') after the upshift. In some examples, the ring register at address 06 may be available for insertion of data from an external source, for example.

According to various examples, the shiftable memory may be a portion of a main memory of a general-purpose computer system. The shiftable memory may represent a subset of the memory that makes up the main memory, for example. Furthermore according to various examples, the shiftable memory is distinct from memory cells, cache and other relatively small memory structures often found integrated together with other components (e.g., an arithmetic logic unit, controller, etc.) in a microprocessor, for example. In particular, shiftable memory by definition herein is part of the main memory and as such, is separate from a processor of a general-purpose computer system or related processing system, according to various examples. In addition, shiftable memory typically contains an order of magnitude or more memory storage than is present or can be present in the processor, according to some examples. For example, shiftable memory may include many megabytes or even gigabytes of memory storage whereas processor memory storage typically may be limited to less than a few tens of bytes (e.g., processor registers) to a few megabytes (e.g., L1 cache, L2 cache etc.). According to some examples, the shiftable memory may be a specialized partition of the main memory or a subsystem thereof.

Further, as used herein, the article 'a' is intended to have its ordinary meaning in the patent arts, namely 'one or more'. For example, 'a ring register' means one or more ring registers and as such, 'the ring register' means 'the ring register(s)' herein. Also, any reference herein to 'top', 'bottom', 'upper', 'lower', 'up', 'down', 'front', 'back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

FIG. 2 illustrates a block diagram of a shiftable memory 100, according to an example of the principles described herein. The shiftable memory 100 provides shifting of a contiguous subset of data words stored in the shiftable memory 100. Further, shifting of data words by the shiftable memory 100 shifts only the data words in the contiguous subset and not other stored data words. In particular, when the shiftable memory 100 performs a shift of the contiguous subset, the shift does not shift other stored data words located outside of the contiguous subset. Further, the shift moves the contiguous subset of stored data words without changing or otherwise affecting an order of the stored data words in the contiguous subset, according to some examples. The shift provided by the shiftable memory 100 may be used to one or both of insert new data words into the shiftable memory 100 and delete data words stored therein, for example.

An external resource (e.g., a processor) communicates data to and from the shiftable memory 100 via a data bus (Data I/O) 102, according to some examples. An address and a length of the contiguous subset may be communicated to the shiftable memory 100 using an address bus (ADDR) 104 and a length bus (LEN) 106, for example. An address bus that carries both the address and the length or alternatively, a pair of addresses, may be employed in another example (not illustrated).

As illustrated, the shiftable memory 100 comprises a plurality of ring registers 110 to store data words and to provide built-in word-level shifting capability. In particular, the built-in word-level shifting shifts the contiguous subset of the data words between sets of the ring registers 110 of the plurality. According to some examples, each ring register 110 comprises a plurality of memory cells configured as an aggregate to store data corresponding to the data word. In some examples, the ring registers 110 of the plurality are configured to store the data word as binary data. For example, a ring register 110 of the plurality may comprise a plurality of memory cells, each memory cell being configured to store a single bit of binary data (e.g., as a '1' or '0'). In combination, the memory cells that individually store binary bits act together to store the data word, for example. In other examples, one or more memory cells of the ring register 110 are configured to store a plurality of binary data bits. For example, each memory cell of the ring register 110 may store a complete data word such that the ring register 110 stores a plurality of data words. In other examples, the ring register 110 may store the data in a form other than as one or more binary bits. The plurality of data bits of the data word defines a width of the ring register 110, according to some examples.

According to various examples, the ring register 110 may be implemented using substantially any memory technology. For example, the memory cells of the ring register 110 may be implemented using static random access memory (SRAM). In another example, one or more flip-flops such as, but not limited to, a D flip-flop, may be employed to implement the memory cells. In other examples, yet another memory technology (e.g., DRAM, etc.) may be used to implement the memory cells of the ring register 110.

According to some examples, the shiftable memory 100 further comprises a controller 120. The controller 120 is configured to select a contiguous subset of the stored data words or equivalently a contiguous subset of ring registers 110. The controller 120 is further configured to shift the selected contiguous subset of the stored data words from a first location to a second location within the plurality of ring registers 110 of the shiftable memory 100. The selected contiguous subset has a length that is less than a total length of the plurality of ring registers 110, according to various examples of the principles described herein. Further, each of the first location and the second location comprises a set of ring registers 110 that has a length (e.g., a number of ring registers 110) that corresponds to a length of the contiguous subset of data words, according to various examples. Using one or more control signals, the controller 120 may shift the selected contiguous subset by instructing the plurality of ring registers 110 to perform the shift, for example.

In various examples, the shiftable memory 100 facilitates one or both of an upshift and a downshift of the contiguous subset of stored data words. In particular, a ring register 110 of the second location within the plurality of ring registers 110 may be located either above or below a corresponding ring register 110 of the first location, depending on a direction of the shift. In some examples, the ring register 110 of the second location is a single ring register (or memory location) away from the corresponding ring register 110 of the first location. In other words, the shift represents movement of the contiguous subset of stored data words by a single memory location or address. In other examples, the second location represents a movement of more than a single ring register 110 (e.g., two or more addresses above or below the first location).

In some examples, the selected contiguous subset is specified by both of an address of a first ring register 110 of the contiguous subset and an address of a last ring register 110 in the contiguous subset. For example, the first ring register address and the last ring register address are communicated to the controller 120 (e.g., via an address bus) to facilitate selecting the contiguous subset. The first ring register address and the last ring register address may be communicated either sequentially as a first address followed by a second address over a single bus (e.g., ADDR 104), for example. Alternatively, the first and last addresses may be communicated in parallel as two simultaneous addresses either over two buses or over two portions of a single, wide bus, for example.

In another example, the selected contiguous subset is specified by an address of the first ring register 110 and a length of the contiguous subset (e.g., via ADDR 104 and LEN 106, as illustrated). In some of these examples, the length may be the length of the contiguous subset that follows the first ring register 110 such that the last ring register address is given by a sum of the first ring register address and the length. In other examples, the length includes the first ring register 110 such that the last ring register address is given by the first ring register address plus the length minus one. Other examples may specify the last ring register address and the length of the contiguous subset that precedes the last ring register, as well as other schemes, for example.

In some examples, the controller 120 comprises an augmented decoder 122. The augmented decoder 122 employs information regarding the address and the length (or alternatively the first and last ring register addresses) to select the contiguous subset of stored data. In some examples, the augmented decoder 122 uses the information (e.g., address and length of the contiguous subset) to assert an output corresponding to each of the ring registers 110 of the selected contiguous subset within the shift register 110. Asserting an output may comprise outputting a logic '1' on a connection path or wire (e.g., a word line) between the augmented decoder 122 and the plurality of ring registers 110, for example. As such, the augmented decoder 122 may output a logic '1' on a plurality of word lines of the plurality of ring registers 110, where the word lines correspond to the ring registers 110 that contain the stored data words of the selected contiguous subset. The word lines may be connected to a load enable (LE) or a select (SEL) input of the ring registers 110, for example. In other examples, asserting an output comprises outputting a logic '0.' Asserting a logic '0' may be used when the ring registers 110 have a 'not' load enable ($\overline{LE}$) or a 'not' select ($\overline{SEL}$) input, for example.

In some examples, the augmented decoder 122 is further configured to assert an additional output corresponding to one of a ring register 110 adjacent to and immediately above the selected contiguous subset or a ring register 110 adjacent to and immediately below the selected contiguous subset. For example, the additional output corresponding to the ring register 110 immediately above the selected contiguous subset may be asserted when the stored data words are to be upshifted within the plurality of ring registers 110. The additional output corresponding to the ring register 110 immediately below the selected contiguous subset may be asserted when the stored data words are to be downshifted within the plurality of ring registers 110, for example. In particular, the additional output may be used to enable the ring register 110 that receives stored data word from either the first ring register 110 or the last ring register 110 of the contiguous subset of data words.

FIG. 3 illustrates a truth table of an augmented decoder 122, according to an example of the principles described herein. In particular, the augmented decoder 122 corresponding to the illustrated truth table is configured to select the contiguous subset in an example plurality of ring registers 110 having eight memory cells. The truth table has three address inputs (ADDR), a length (LEN) input and eight word lines W (i.e., $W_0$-$W_7$). The eight word lines W may correspond to load enable (LE) inputs of eight memory cells in the example plurality of ring registers 110, for example. As can be seen in the truth table, for a value of LEN equal to '00', the augmented decoder 122 functions substantially similar to a conventional decoder (i.e., only one word line W is asserted at a time). However, a plurality of word lines W are asserted for all other values of LEN facilitating simultaneous enabling of a corresponding plurality of memory cells that hold or store the selected contiguous subset of stored data to be shifted.

In some examples, the augmented decoder 122 may be implemented using a read only memory (ROM). The ROM is programmed with a truth table that specifies the functionality of the augmented decoder 122. A decoder of the ROM decodes an input (e.g., ADDR and LEN) and the programmed connections within the ROM augment the output of the ROM decoder to produce the augmented decoder 122 functionality, for example. In another example, a conventional decoder may be augmented with an output circuit other than the programmed connections to implement the augmented decoder 122. In another example, the augmented decoder 122 may be implemented using a latched ripple cascade.

Figure 4A:
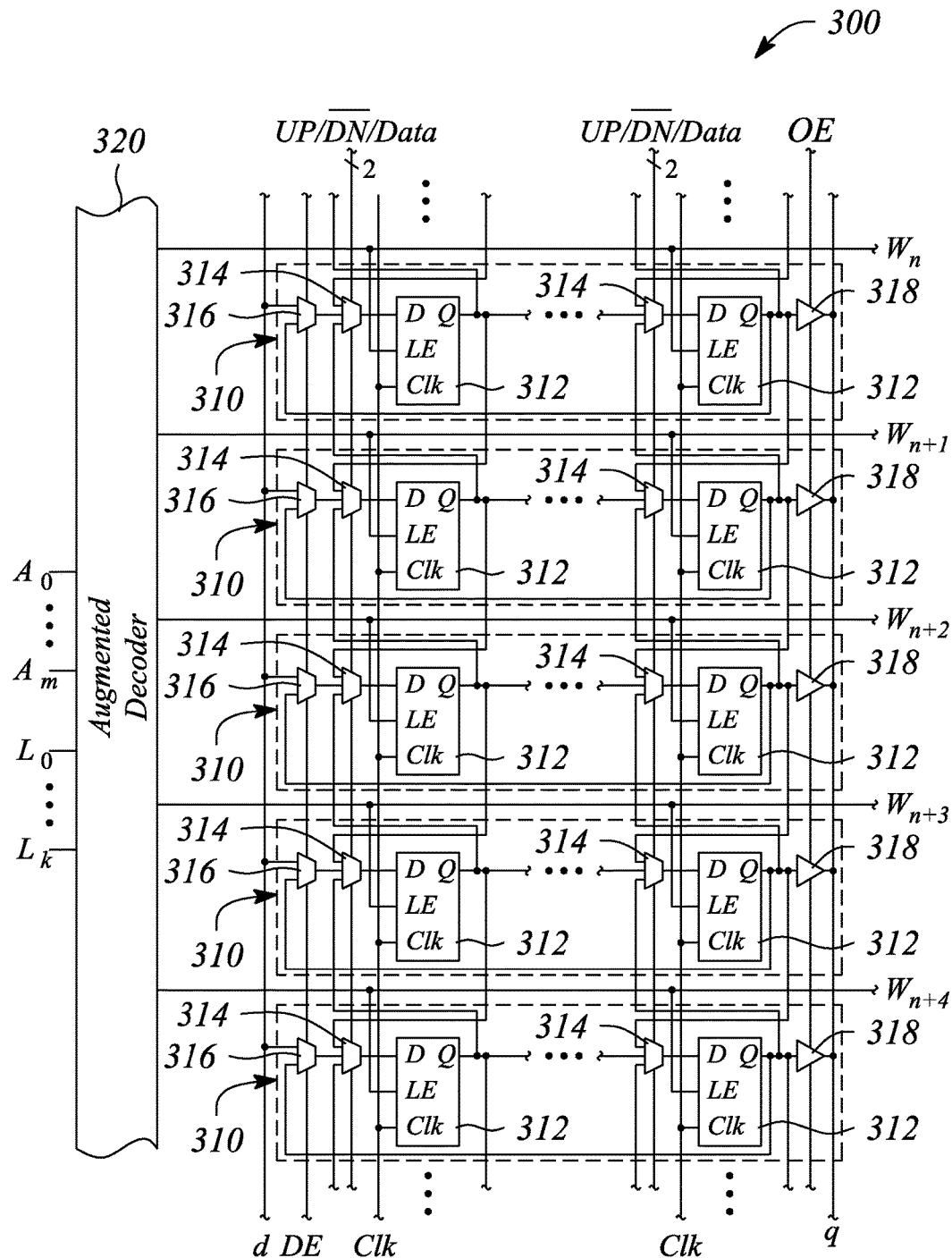
FIG. 4A illustrates a schematic diagram of a shiftable memory, according to an example of in accordance with the principles described herein.

FIG. 4A illustrates a schematic diagram of a shiftable memory 300, according to an example of the principles described herein. As illustrated, the shiftable memory 300 comprises a plurality of ring registers 310 connected to an augmented decoder 320. As illustrated in FIG. 4A, each of the ring registers 310 of the shiftable memory 300 comprises a plurality of memory cells 312 and logic circuits 314 as well as an input switch 316 and an output tristate buffer 318. The memory cell 312 may comprise a static random access memory (SRAM) memory cell, for example. In another example, the memory cell 312 may comprise a flip-flop (e.g., a D-type flip-flop). In yet other examples, the memory cell 312 may comprise another type of memory cell.

The plurality of ring registers 310 are arranged vertically as a linear array with each ring register 310 being connected to a different one of a plurality of word lines W (e.g., $W_n$, $W_{n+1}$, etc.) from the augmented decoder 320, as illustrated. The word lines W associated with each ring register 310 are connected in parallel to a load enable LE of each of the memory cells 312 of the ring registers 310, as illustrated. The load enable LE is used to enable loading data into (e.g., latch data present at a data input D) and reading data from (e.g., enable an output Q of) the memory cells 312, for example. A clock line Clk of each of the SRAM cells 312 is connected in common to all SRAM cells 312 at a clock input Clk.

The plurality of ring registers 310 illustrated in FIG. 4A may be substantially similar to the plurality of ring registers 110, described above with respect to the shiftable memory 100. According to some examples, the augmented decoder 320, in combination with additional logic (not illustrated), serves as the controller of the shiftable memory 300. The controller may be substantially similar to the controller 120, described above with respect to the shiftable memory 100, according to some examples. In fact, according to some examples, the augmented decoder 320 is substantially similar to the augmented decoder 122. Moreover, the shiftable memory 300 represents an example implementation of the shiftable memory 100 described above.

According to various examples, the plurality of memory cells 312 in each ring register 310 may be used together to store a data word comprising a plurality of binary bits, for example. External data is written to the ring registers 310 in a serial manner using an input data line d, for example. Data stored by the ring registers 310 may be accessed and read out of the ring registers 310 serially using an output data line q, for example. In some examples (not illustrated), the input data line d and the output data line q are one or both of converted to a parallel format and multiplexed to facilitate connection to a common data bus (e.g., Data I/O 102, illustrated in FIG. 2).

The input switch 316 of each ring register 310 is connected between an input of the ring register 310 and each of the input data line d and the output data line q of the ring register 310. The input switch 316 is used to select and route data from either the input data line d or the output data line q of the ring register 310 when the ring register 310 is enabled (e.g., using an appropriate word line W). When the input data line is selected, data bits from the input data line d may be clocked sequentially into the ring register 310 to accomplish a serial write operation. Alternatively, data bits stored in the memory cells 312 of the ring register 310 may be circulated around the loop of the ring register 310 when the output data line q is selected. Circulating data bits may be used to sequentially output stored data during a serial read operation, for example. In general, only one ring register 310 is enabled at a time during either of the serial write operation or the serial read operation.

In some examples, the input switch 316 may be implemented as a multiplexer. In other examples, the input switch 316 may comprise a plurality of tri-state buffers. In yet other examples, the input switch 316 may comprise another single pole double throw switch implementation. The input switch 316 is controlled by a data enable DE line.

In some examples, the output tristate buffer 318 is used to isolate the ring register 110 from the output data line q except during a serial read operation. For example, during a serial read operation, the output tristate buffers 318 may be enabled using an output enable line OE (e.g., the output enable line OE is asserted). Then, the data bits stored in the enabled ring register 310 may be clocked sequentially out of the ring register 310 and onto the output data line q through the enabled tristate buffer 318 associated with the enabled ring register 310, for example. Conversely, when the output tristate buffer 318 is not enabled (e.g., when the output enable line OE is not asserted), the outputs of the ring registers 310 are isolated from the output data line q and from one another, according to various examples.

Each memory cell 312 has an associated logic circuit 314 connected to a data input D of the memory cell 312 at an output of the logic circuit 314. The associated logic circuit 314 has three inputs that are connected respectively to each of a source of external data for the memory cell 312, an output Q of a corresponding memory cell 312 of the ring register 310 immediately below the memory cell 312, and an output Q of another corresponding memory cell 312 of the ring register 310 immediately above the memory cell 312. The logic circuit 314 is configured to select the source of external data during either a serial write operation or a serial read operation. The logic circuit 314 is configured to select the output Q of the corresponding memory cell 312 immediately below the memory cell 312 when stored data is to be shifted up within the shiftable memory 300. The logic circuit 314 is further configured to select the output Q of the corresponding memory cell 312 immediately above the memory cell 312 when stored data is shifted down within the shiftable memory 300.

For example, control of the selection by the logic circuit 314 may be provided by a control input UP/$\overline{DN}$/Data, as illustrated. Specifically, when UP is asserted, stored data within the ring registers 310 of the shiftable memory 300 is upshifted while stored data is downshifted when UP is not asserted (i.e., when $\overline{DN}$ is asserted). A first register 310 and a range of ring registers 310 that participate in the upshift or downshift are controlled by a combination of the address ($A_0, \ldots, A_m$) and length ($L_0, \ldots, L_k$) provided to the augmented decoder 320, for example. Asserting Data places the shiftable memory 300 in a write/read mode similar to facilitate performing a serial write operation or a serial read operation on the ring register 310 selected by the word lines W of the augmented decoder 320 based on the input address ($A_0, \ldots, A_m$), according to some examples. As described above, whether a serial write operation or a serial read operation is performed is further determined by a state of the data enable DE line connected to the input switch 316.

In some examples, the logic circuit 314 comprises a multiplexer circuit. For example, the multiplexer circuit may be a three-input multiplexer configured to select one of the three inputs defined above for application to the data input D of the memory cell 312. In other examples, the logic circuit 314 may comprise a plurality of tri-state buffers, one tri-state buffer for each of the three defined inputs of the logic circuit 314. In yet other examples, the logic circuit 314 may comprise a combination of one or more multiplexers (e.g., a two-input multiplexer), one or more tri-state buffers and various other logic gates.

Figure 4B:
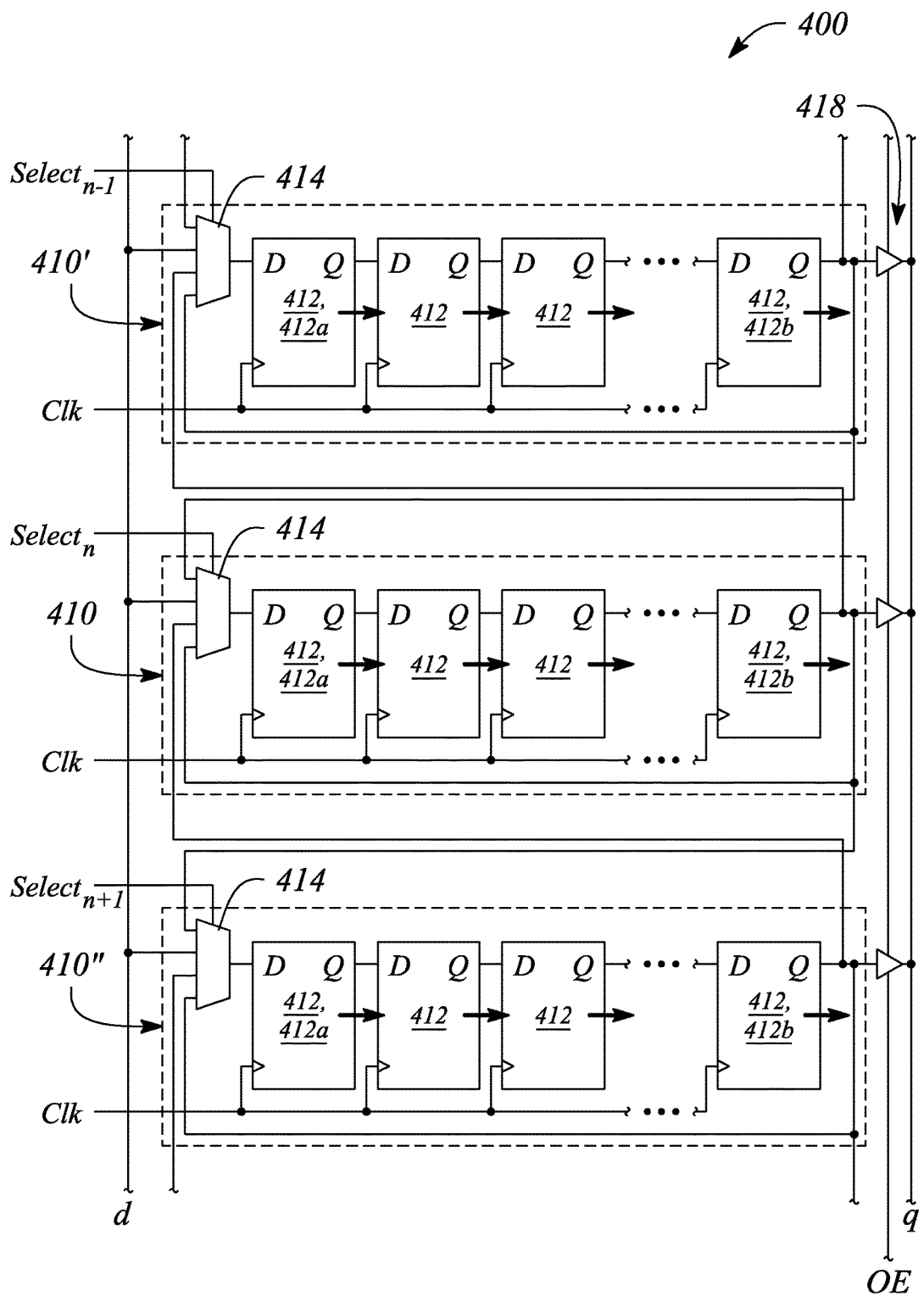
FIG. 4B illustrates a schematic diagram of a shiftable memory, according to another example in accordance with the principles described herein.

FIG. 4B illustrates a schematic diagram of a shiftable memory 400, according to another example of the principles described herein. In particular, as illustrated, ring registers 410, 410', 410" of the shiftable memory 400 each comprises a plurality of memory cells 412, 412a, 412b (e.g., D flip-flops) connected or functionally arranged as a shift register. The ring registers 410, 410', 410" further each comprises a multiplexer 414 at an input of the shift register adjacent to a first memory cell 412a of the respective shift register. As illustrated, the multiplexer 414 is configured to select among one of four inputs to be applied to a data input D of the first memory cell 412a of the shift register. Selection among the four inputs is according to a Select (e.g., Select$_{n-1}$, Select$_n$, Select$_{n+1}$) input. The Select input may be provided by a controller (not illustrated), for example.

Further as illustrated, an input data line d may provide external data for writing to the ring registers 410, 410', 410" and an output data line q may be used for reading data from the ring registers 410, 410', 410", for example. Output tristate buffers 418 may be employed to isolate the ring registers 410, 410', 410" from the output data line q and from one another, as was described above with respect to output tristate buffers 318, for example. An output enable line OE may be used to enable the output tristate buffers 418, for example.

Specifically, a first of the four selectable inputs of the multiplexer 414 is connected to the input data line d, as illustrated in FIG. 4B. The first selectable input may be selected when external data are to be written to and stored by the memory cells 412, 412a, 412b. For example, data may be loaded into a first ring register 410 in a serial manner by sequentially presenting data bits via the data input line d to the selected first input of the multiplexer 414 and then applying a clock pulse to the memory cells of the first ring register 410, for example. According to some examples, the clock pulses cause the data bits to move or shift along a length of the shift register, one memory cell 412, 412a, 412b per clock pulse. A complete data word may be loaded in a number of clock pulses equal to a number of memory cells 412, 412a, 412b in the first ring register 410, for example. Heavy arrows in FIG. 4B illustrate data bits being shifted along the shift register of the ring register 410 by the clock pulses, by way of example.

As illustrated, a second of the four selectable inputs of the multiplexer 414 is connected to an output Q of a last or terminal memory cell 412b at an output of the first ring register 410. The second selectable input may be selected when data (e.g., data bits) within the ring register are to be circulated around a loop of the first ring register 410. In particular, as the clock pulses are applied to the memory cells 412, 412a, 412b of the first ring register 410, data bits are shifted or 'clocked' along the shift register until the data bits reach the terminal memory cell 412b. Upon exiting the terminal memory cell 412b, the data bits are communicated back to the first memory cell 412a through the multiplexer 414, when the second input is selected. In some examples, the second selectable input may be selected when performing a serial read of the data word stored by the first ring register 410. For example, the data bits stored in the first ring register 410 may be read in a serial manner as the data bits exit the terminal memory cell 412b and loop or circulate back to the first memory cell 412a through the multiplexer 414.

Further as illustrated in FIG. 4B, a third of the four selectable inputs of the multiplexer 414 is connected to an output Q of a terminal memory cell 412b of a second ring register 410' at an address or memory location immediately above the first ring register 410. Selecting the third selectable input may be used to downshift data words within the shiftable memory 400, for example. In particular, as clock pulses are applied, the data word stored in the second ring register 410' is clocked into the first ring register 410 through the selected third input of the multiplexer 414. As above, the data bits of the data word may be clocked one bit per clock pulse (e.g., provided via a clock line Clk, as illustrated), for example.

Finally, a fourth of the four selectable inputs of the multiplexer 414 is connected to an output Q of a terminal memory cell 412b of a third ring register 410" at an address or memory location immediately below the first ring register 410. The fourth selectable input may be selected to upshift data words within the shiftable memory 400. In particular, a data word stored in the third ring register 410" may be clocked into the first ring register 410 through the selected fourth input of the multiplexer 414 in a manner analogous to that used for downshifting described above, for example.

Stored data may be held and not shifted (i.e., upshifted or downshifted) when a particular ring register 410 is not one of the ring registers 410 that stores data of the contiguous subset, for example. In particular, the multiplexer 414 may have a Null Select (not illustrated) that substantially disables communication of data bits through the multiplexer 414, according to some examples. In addition or alternatively, a select that disables shifting within a shift register of the particular ring register 410 may be employed to prevent one or more of serial reading, serial writing, upshifting and down shifting, for example. According to various examples, the multiplexer 414 may be an actual multiplexer or may be a logic circuit that functions as a multiplexer (e.g., implemented with tri-state buffers, switches, etc.).

The shiftable memory 400 illustrated in FIG. 4B may further comprise a controller (not illustrated), according to some examples. The controller may comprise an augmented decoder substantially similar to the augmented decoder 122 described above with respect to the shiftable memory 100. In particular, the controller may provide an output or outputs to the Select inputs of individual ones of the ring registers 410 for participation in an upshift or a downshift (e.g., to control selection of the third and fourth inputs of the multiplexers 414). Participation may be determined in the augmented decoder by an address (ADDR) and a length (LEN) of the contiguous subset of stored data to be shifted, for example. Likewise, the controller may provide output(s) to select among the first and second inputs of the multiplexers 414 of those ring registers 410 that are to be written to or read from, for example. The shiftable memory 400 may represent another example implementation of the shiftable memory 100, described above, according to some examples.

Figure 5:
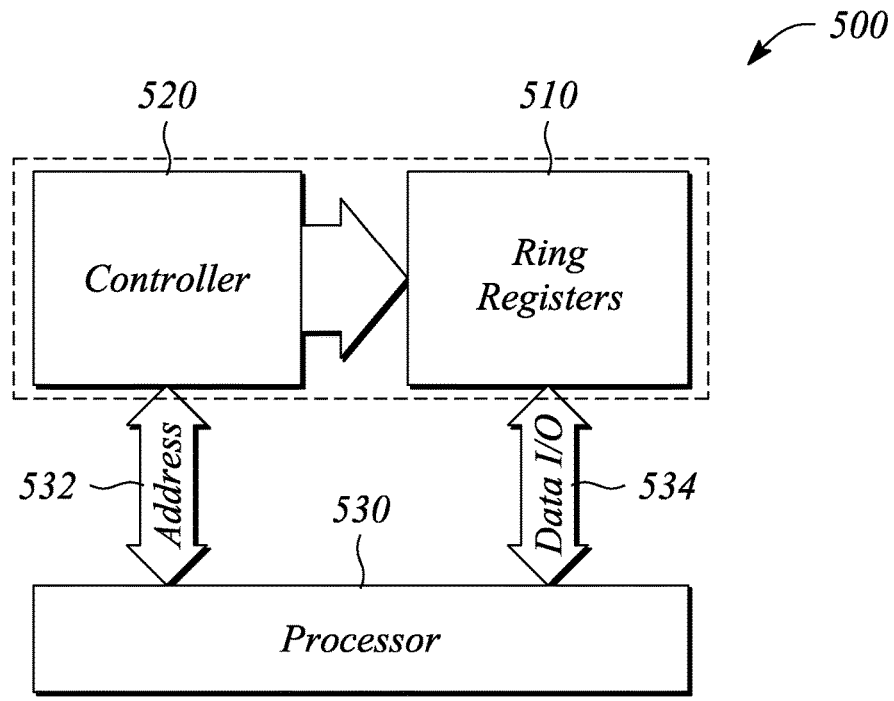
FIG. 5 illustrates a block diagram of a shiftable memory system, according to an example in accordance with the principles described herein.

FIG. 5 illustrates a block diagram of a shiftable memory system 500, according to an example of the principles described herein. The shiftable memory system 500 comprises a plurality of ring registers 510 arranged adjacent to one another in an array. Each ring register 510 is configured to store a plurality of data bits corresponding to a data word. According to some examples, the ring registers 510 arranged in the array may be substantially similar to the ring registers 110 of the shiftable memory 100, described above. In particular, the adjacent ring registers 510 may be interconnected to directly transfer corresponding data bits from one of the ring registers to the other ring register during a shift, for example. In other examples, adjacent ring registers 510 are interconnected 'output to input' such that data bits are transferred by clocking data bits one-by-one out of a first one of the adjacent ring registers 510 and into a second one of the adjacent ring registers 510, and so on.

As illustrated in FIG. 5, the shiftable memory system 500 further comprises a controller 520. The controller 520 is configured to select and shift a contiguous subset of data words within the array of the ring registers 510. The contiguous subset of data words has a length that is less than a total length of the array. The shift represents either of an upshift or a downshift of the selected contiguous subset within the array. The shift of the selected contiguous subset does not result in a shift of other data words located outside of the selected contiguous subset. In some examples, the controller 520 may be substantially similar to the controller 120 described above with respect to the shiftable memory 100.

In particular, the controller 520 may comprise an augmented decoder (not illustrated) to assert a load enable or otherwise select each ring register 510 from a beginning to an end of the selected contiguous subset of data words, according to some examples. The beginning of the selected contiguous subset may correspond to the address and the end may correspond to a sum of the address and the length received, for example. The controller 520 may further be configured to assert a load enable, word line, or an equivalent corresponding to at least one of a ring register 510 immediately above the ring register 510 at the beginning and a ring register 510 immediately below the ring register 510 at the end of the contiguous subset depending on a direction of the shift within the array.

In some examples, the shiftable memory system 500 further comprises a processor 530. The processor 530 is configured to provide the address and the length of the contiguous subset of data words. The processor 530 may communicate with the controller 520 via an address bus (Address) 532. For example, the processor 530 may provide the address and the length directly as an address of a ring register 510 corresponding to a beginning of the contiguous subset and a length that determines a ring register 510 corresponding to an end of the contiguous subset. In another example, a first address of the ring register 510 corresponding to the beginning and a second address corresponding to the end of the contiguous subset may be provided by the processor 530. In this example, the provided length may be inferred from a difference between the first and second addresses. Further, the processor 530 may communicate with the ring register 510 using a data bus (Data I/O) 534. For example, the data bus 534 may be used by the processor 530 to write data to the ring register 510. Similarly, data stored by the ring register 510 may be read by the processor 530 using the data bus 534, for example.

According to some examples, the processor 530 may be a central processor (e.g., a CPU such as a microprocessor) of a general-purpose computer that employs the shiftable memory system 500, for example. However, the plurality of ring registers 510 and the controller 520 are distinct and separate from the processor 530, according to various examples. For example, the plurality of ring registers 510 and the controller 520 may be a specialized part of a memory system (e.g., RAM) that is employed by the processor 530. In particular, the ring registers 510 and the controller 520 are not conventional shift registers of the processor 530, for example. A dashed line in FIG. 5 illustrates the physical separation between the processor 530 and the ring registers 510 and the controller 520.

Figure 6:
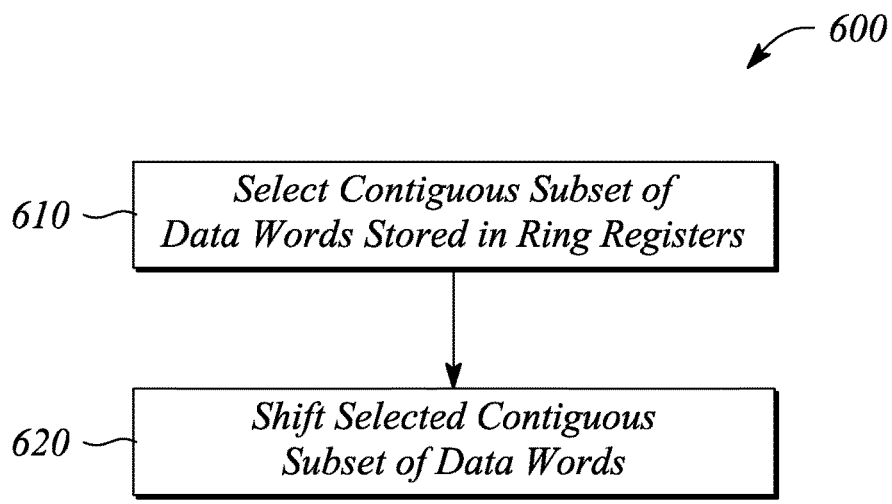
FIG. 6 illustrates a flow chart of a method of shifting data in a shiftable memory, according to an example in accordance with the principles described herein.

FIG. 6 illustrates a flow chart of a method 600 of shifting data in a shiftable memory, according to an example of the principles described herein. As illustrated, the method 600 of shifting data in a shiftable memory comprises selecting 610 a contiguous subset of data words stored in ring registers of a memory having built-in word-level shifting capability. A size or length of the selected 610 contiguous subset of data is less than a total size or length of the memory. In some examples, selecting 610 a contiguous subset of data comprises providing an address and the length of the selected contiguous subset. The address designates a ring register within the memory corresponding to a beginning of the contiguous subset of data, and a sum of the address and the length designates a ring register within the memory corresponding to an end of contiguous subset of data, for example. In other examples, selecting 610 a contiguous subset of data comprises providing a start address and a stop address. The start address is the address of the ring register corresponding to the beginning of the contiguous subset while the stop address is the address of the ring register corresponding to the end of the contiguous subset, for example.

The method 600 of shifting data in a shiftable memory further comprises shifting 620 the selected contiguous subset of data from a first location to a second location within the memory. However, when the selected contiguous subset is shifted 620, the shifting 620 occurs entirely within the memory. Moreover, shifting 620 the selected contiguous subset does not shift other stored data words located outside of the selected contiguous subset.

In some examples, shifting 620 the selected contiguous subset comprises circulating data bits of the data word stored in a first ring register at the first location to sequentially present each data bit of the stored data word at an output of the ring register. For example, circulating data bits may be used to one or both of upshift data words and downshift data words within the shiftable memory. In some examples, shifting 620 the selected contiguous subset further comprises sequentially writing the presented data bits into a second ring register to store the data word at the second location within memory.

In some examples, the method 600 of shifting data in a shiftable memory further comprises, after shifting 620 the contiguous data subset of data, one of writing data to the memory to provide the stored data and reading data from the memory. One or both of writing and reading may comprise circulating data bits of the data word around a ring of the ring register, for example. According to various examples, the method 600 of shifting data in a shiftable memory may be implemented using one or more of the shiftable memory 100 and the shiftable memory system 500 as well as either of the shiftable memory 300 and the shiftable memory 400, described above.

Thus, there have been described examples of a shiftable memory, a shiftable memory system and a method of shifting data in a shiftable memory, each employing ring registers to shift a contiguous subset of stored data within the shiftable memory. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A computing device comprising:
    a processor; and
    a main memory system coupled to the processor, the main memory system comprising:
        a memory comprising a plurality of ring registers to store data words, and
        a memory controller to, in response to a receipt of an address and a length of a contiguous subset of the data words from the processor, control the plurality of ring registers to shift the contiguous subset of data words from a first location to a second location within the memory, the contiguous subset of data words having a size that is smaller than a total size of the memory, wherein the plurality of ring registers shifts only data words stored inside the contiguous subset when the contiguous subset is shifted.

2. The computing device of claim 1, wherein a ring register of the plurality comprises memory cells to store data bits corresponding to a data word stored in the ring register.

3. The computing device of claim 2, wherein the ring register further comprises a logic circuit to select among a plurality of inputs that are to be applied by the logic circuit to a data input of the ring register, the plurality of inputs comprising:
    an external data input to be selected by the logic circuit when external data is to be written to and stored by the memory cells of the ring register,
    an output of a first adjacent ring register immediately below the ring register to be selected by the logic circuit when stored data is to be upshifted within the memory, and
    an output of a second adjacent ring register immediately above the ring register to be selected by the logic circuit when stored data is to be downshifted within the memory.

4. The computing device of claim 1, wherein the ring registers provide serial input/output lines for writing the data words to the ring registers and reading the data words from the ring registers.

5. The computing device of claim 1 wherein the length received by the memory controller from the processor indicates a numerical quantity of ring registers required to store the contiguous subset of the data words.

6. The computing device of claim 1, wherein the controller comprises an augmented decoder to assert an output corresponding to each of the ring registers associated with the contiguous subset of data words.

7. The computing device of claim 6, wherein the augmented decoder to further assert an additional output corresponding to a ring register adjacent to and one of immediately above a first ring register associated with the selected contiguous subset of data words and immediately below a last ring register associated with the selected contiguous subset of data words, the additional output corresponding to the ring register immediately above the first ring register being asserted when the stored data is to be upshifted within the memory and the additional output corresponding to the ring register immediately below the last ring register being asserted when the stored data is to be shifted down within the memory.

8. A shiftable memory system comprising:
    a plurality of ring registers arranged adjacent to one another in an array, the plurality of ring registers to store a plurality of data words, each ring register of the plurality to store a plurality of data bits corresponding to a data word;
    a controller to, in response to a receipt of an address and a length of a contiguous subset of data words from a processor, control the plurality of ring registers to shift the contiguous subset of data words within the array, wherein the length of the contiguous subset of data words is less than a total length of the array, the plurality of ring registers to perform either an upshift or a downshift of only the contiguous subset of data words within the array selected by the controller.

9. The shiftable memory system of claim 8, wherein the shiftable memory system forms all or a portion of a main memory of a computing device, the computing device comprising the processor to provide the address and the length of the contiguous subset of data words to the controller.

10. The shiftable memory system of claim 8, wherein the controller comprises an augmented decoder to assert an output corresponding to each of the ring registers of the set corresponding to the selected contiguous subset of data words within the memory.

11. The shiftable memory system of claim 8, wherein adjacent ring registers are interconnected to directly transfer corresponding data bits from one of the ring registers to an adjacent one of the ring registers during the shift.

12. A method of shifting data in a shiftable memory, the method comprising:
    receiving from a processor, by a memory controller, an address and a length of a contiguous subset of data words stored in a plurality of ring registers of a memory having built-in word-level shifting capability, a size of the contiguous subset of data words being less than a total size of the memory; and
    in response to a receipt of the address and the length, controlling, by the memory controller, the plurality of ring registers to shift the contiguous subset of data words from a first location to a second location within the memory,
    wherein when the contiguous subset is shifted, the shifting occurs entirely within the memory and does not shift other stored data words located outside of the contiguous subset.

13. The method of shifting data in a shiftable memory of claim 12, wherein the address specifies a ring register within the memory corresponding to a beginning of the contiguous subset of data words, and wherein the length specifies a numerical quantity of ring registers required to store the contiguous subset of data words.

14. The method of shifting data in a shiftable memory of claim 12, wherein shifting the selected contiguous subset comprises:
    circulating data bits of the data word stored in a first ring register at the first location within memory to sequentially present each data bit of the stored data word at an output of the ring register; and
    sequentially writing the presented data bits into a second ring register to store the data word at the second location within memory.

15. The method of shifting data in a shiftable memory of claim 12, wherein the plurality of ring registers forms all or a portion of a main memory of a computing device.

16. The method of shifting data in a shiftable memory of claim 12, wherein the memory controller includes a truth table, and further comprising:
    determining, using the truth table in the memory controller, a plurality of word line values based on an address input and a length input.

17. The method of shifting data in a shiftable memory of claim 16, wherein the truth table is implemented in Read Only Memory (ROM) included in the memory controller.

18. The shiftable memory system of claim 8, wherein the controller includes a truth table to determine a plurality of word line values based on an address input and a length input.

19. The shiftable memory system of claim 18, wherein the truth table is implemented in Read Only Memory (ROM) included in the controller.

20. The computing device of claim 1, wherein the memory controller includes a truth table implemented in Read Only Memory (ROM), the memory controller to use the truth table to determine a plurality of word line values based on an address input and a length input.

* * * * *